US006661663B1

(12) United States Patent
Meeker

(10) Patent No.: US 6,661,663 B1
(45) Date of Patent: Dec. 9, 2003

(54) FIBER GUIDE CONNECTED TO A HEATSINK FASTENER

(75) Inventor: Matthew K. Meeker, Santa Rosa, CA (US)

(73) Assignee: Calix Networks, Inc., Petaluma, CA (US)

( * ) Notice: Subject to any disclaimer, the term of this patent is extended or adjusted under 35 U.S.C. 154(b) by 0 days.

(21) Appl. No.: 10/072,598

(22) Filed: Feb. 5, 2002

(51) Int. Cl.[7] ................................................ H05K 7/20
(52) U.S. Cl. ...................... 361/719; 24/458; 29/890.03; 257/722; 385/92; 385/94
(58) Field of Search .................... 29/890.03; 438/48; 24/453, 457, 458; 165/80.3, 185; 174/16.3; 385/52, 88, 92, 94, 114, 135; 361/687, 703, 704, 705, 717–719; 257/707, 712, 713, 718, 719, 722, 724, 726, 727

(56) References Cited

U.S. PATENT DOCUMENTS

| 5,130,888 A | | 7/1992 | Moore | 361/717 |
|---|---|---|---|---|
| 5,276,585 A | * | 1/1994 | Smithers | 361/704 |
| 5,513,073 A | * | 4/1996 | Block et al. | 361/719 |
| 6,093,961 A | | 7/2000 | McCullough | 257/718 |
| 6,153,932 A | * | 11/2000 | Liang | 257/712 |
| 6,219,239 B1 | | 4/2001 | Mellberg et al. | 361/704 |
| 6,325,552 B1 | * | 12/2001 | Brillhart | 385/88 |
| 6,061,239 A1 | | 5/2002 | Blomquist | 361/704 |
| 6,397,941 B1 | | 6/2002 | McCullough | 165/185 |
| 6,424,530 B1 | | 7/2002 | Lee et al. | |
| 6,508,595 B1 | * | 1/2003 | Chan et al. | 385/92 |

OTHER PUBLICATIONS

US PG pub., US2002/0131749 A1, Swenson et al, filed Mar. 16, 2001.*
USPG pub. US2003/0002557 A1, Galeotti et al, filed Jun. 27, 2002.*

* cited by examiner

Primary Examiner—Gerald Tolin
(74) Attorney, Agent, or Firm—Silicon Valley Patent Group LLP

(57) ABSTRACT

A combination device includes an optical fiber guide connected to a fastener for attaching a heatsink to a component and/or to be printed circuit board. As a component on a printed circuit board usually needs to be fastened to a heatsink for cooling, combining a heatsink fastener and a fiber guide allows a more efficient use of board space than using a fiber guide and a heatsink fastener separately. In one embodiment, the device includes a frame, one or more fiber guides attached to the frame, and one or more fasteners (e.g., a snap-on mechanism) connected to the frame. The frame may generally have a rectangular shape, with fiber guides attached to the four corners of the rectangular frame and fasteners attached to the side of the rectangular frame. The fiber guide may be designed to protect the fragile optical fiber and prevent bending of the cable beyond its minimum bend radius.

33 Claims, 10 Drawing Sheets

FIBER GUIDE CONNECTED TO A HEATSINK FASTENER

CROSS REFERENCE TO RELATED APPLICATION

This application is related to, and incorporates by reference herein in its entirety, the commonly owned U.S. patent application, entitled "A Heat Sink With A Cutout" filed concurrently herewith by Darin P. Smedberg, now U.S. patent application Ser. No. 10/071,968.

FIELD OF INVENTION

The present invention relates generally to fiber optic cable handling and more particularly to routing fiber optic cables around a printed circuit board.

BACKGROUND

Fiber optic cables may be mounted on a printed circuit board using a fiber guide 16 (FIG. 1) that is normally affixed to a printed circuit board 19 using rivets 18. Instead of rivets, other fasteners such as adhesive tape, screws, snaps or standoff may be used. Affixing fiber guide 16 to printed circuit board 19 normally requires that the printed circuit board 19 have a number of holes through which rivets 18 pass. A cable tie 14 may be used to attach an optical cable 10 to fiber guide 16.

As is well known in the art, optical cable 10 of FIG. 1 normally contains one or more fibers 12.

SUMMARY

A fiber guide in accordance with the invention is indirectly supported by a printed circuit board, instead of being mounted directly thereon. Depending on the embodiment, one or more fiber guides are attached to an item (such as a heatsink, or a clip for attaching the heatsink) that in turn is supported in the normal manner (either directly or indirectly) on the printed circuit board. The indirect support of a fiber guide in accordance with the invention more efficiently uses the space on a printed circuit board, than if the fiber guide was directly mounted on the printed circuit board (as discussed above in the background section). Specifically, indirect mounting of the type described herein eliminates the holes of the prior art required for riveting the fiber guide to the printed circuit board, and frees up the space on the printed circuit board equal to the footprint of the fiber guide, thereby to allow this space to be used for other components (such as integrated circuits).

In one embodiment, one or more fiber guides are integrally connected to and formed as extensions of a heatsink clip (such an extended clip is also called "dual purpose clip"), for example at the periphery. Such extension(s) of a heatsink clip (e.g. one at each of four corners of a rectangular clip) may be formed of a thermally insulated material (such as plastic), so as to keep a cable supported by the extension(s) from being heated up by conductive heat transfer from a heatsink during normal operation. The material of the extension(s) may be same as the material of which a heatsink clip is normally formed, depending on the implementation. Therefore, in one embodiment, a heatsink clip and one or more fiber guides (formed as extensions therefore) are formed of a common material, as a single piece, although in other embodiments, one or more fiber guides may be mounted directly on a heatsink. A dual purpose clip of the type described above simplifies the assembly of a printed circuit board, and also reduces the total number of parts that need to be assembled, as compared to fiber guides that are separately mounted on a heatsink (or even on a printed circuit board).

In one embodiment, a dual purpose clip of the type described above includes a frame, one or more fiber guides attached to the frame, and one or more fasteners also attached to the frame. The frame may have a shape that depends on the heatsink and/or the electronic component to be cooled, for example a rectangular shape. In one specification implementation, four fiber guides are integrally connected to the four corners of a rectangular frame, and four fasteners are integrally connected to the four sides of the rectangular frame. Any type of fiber guides and/or fasteners may be used in such an implementation, depending on the design of the electronic component and/or the heatsink. Examples of fasteners include a snap-on/clip-on feature, e.g. fastening hooks, a spring feature, or a screw. Also, depending on the embodiment, the fiber guides and/or the fasteners may be made detachable from the frame. Moreover, although a rectangular frame is used in some embodiments, the frame can have other shapes (such as oval, circular or triangular) in other embodiments.

A fiber guide that is used in one specific example has a curvature, although in another embodiment there is no curvature. When a curvature is present, the curvature may be less than the curvature allowed by a minimum bend radius (e.g. as defined in an industry standard or by widely accepted practice) of a fiber optic cable. In one specific example, each of four fiber guides has the shape of an arc of a circle wherein the circle has the minimum bend radius, and the center of the circle is offset from the center of the frame, along a diagonal of the frame. In one specific implementation, a fiber guide used in a combination clip of the type described above has a number of walls that either partially or completely enclose an annular space around the arc of the circle, so that a fiber optic cable can be held in the annular space without need for a cable tie as in the prior art (described above in the Background section).

DETAILED DESCRIPTION

Figure 2A:
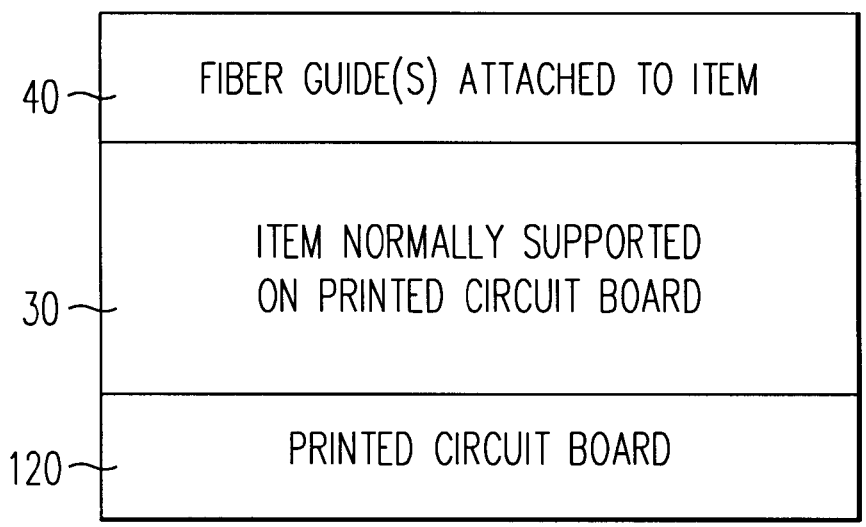
FIGS. 2A–2B illustrate, in conceptual block diagrams, indirect mounting of fiber guides on an item that is normally supported on a printed circuit board, in accordance with the invention.
Figure 2B:
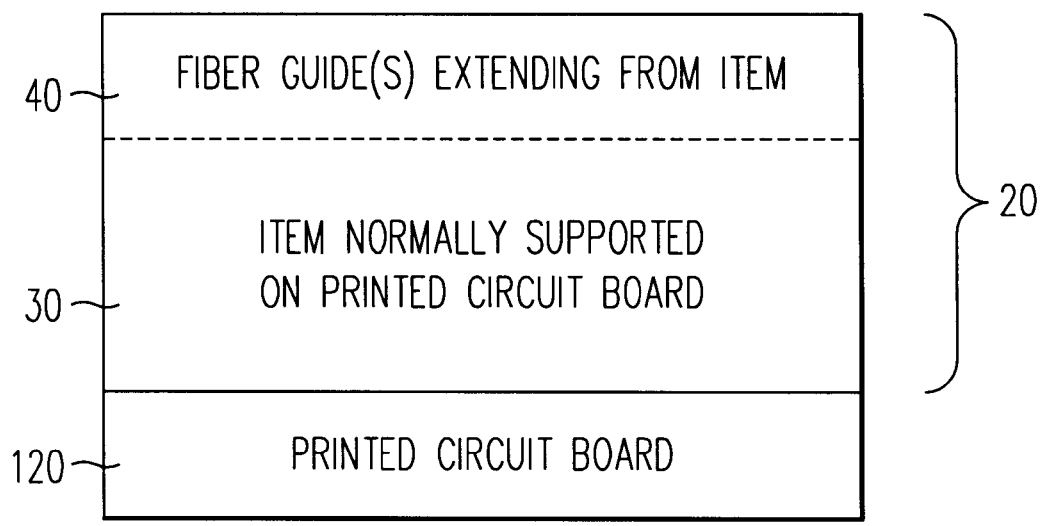

In accordance with the invention, a cable, such as a fiber optic cable, is supported via an item 30 (FIG. 2A) that is normally supported on a printed circuit board 120. Item 30 can be anything, such as a heatsink clip, or a heatsink itself, that is supported either directly or indirectly on a printed circuit board 120. Although in one embodiment, one or more fiber guides for supporting a fiber optic cable are integrated into a heatsink clip that is used to keep a heatsink in contact with an electronic component normally mounted on a printed circuit board (as illustrated in FIG. 2B), to form a device 20, in other embodiments of the invention such fiber guides or other supports for a fiber optic cable may be directly attached to a heatsink and/or an electronic component. As noted above, the indirect support of a cable (through one or more items normally supported on a printed circuit board) as described herein frees up space on a printed circuit board that is otherwise used (when a fiber guide or other cable support is directly mounted on a printed circuit board).

Furthermore, although in certain embodiments, the fiber guides extend in a direction parallel to the printed circuit board to ensure that the fiber guides do not unduly protrude in a direction perpendicular to the printed circuit board, and avoid interfering with the air flow around the heatsink, in alternative embodiments, the fiber guides may be mounted extending perpendicularly (or at any angle) from the printed circuit board, e.g. within the footprint of a normally-present item, so as to make room for similar surrounding items on the printed circuit board.

In accordance with one embodiment of the present invention, device 20 (FIG. 2B) includes a clip for attaching a heatsink to a component and also includes at least one fiber guide for routing an optical fiber cable. Such a device 20 (also called "dual purpose clip") serves at least two purposes in accordance with the invention, e.g. supports a fiber optic cable and also attaches a heatsink to a component on a printed circuit board. Note that the word "heatsink" may also be spelled as two words "heat sink".

In one embodiment, device 20 (FIGS. 3A–3C) includes a heatsink clip 30 and four fiber guides 40a–40d that are integrally connected to one another. Clip 30 includes rectangular frame 31 with a hole 32. One specific example of clip 30 is described in U.S. Pat. No. 6,153,932 which is incorporated by reference herein in its entirety. Such a clip 30 may be custom built to have fiber guides integrally formed thereon, e.g. by the Custom Components Division of Intricast Company, 2160 Walsh Avenue, Santa Clara, Cailf. 95050 (see www.intricast.com). Each of the four fiber guides 40a–40d is attached to the four corners 34a, 34b, 34c, and 34d of frame 31, and the fasteners of clip 30 are connected to the four sides 33a, 33b, 33c, and 33d of frame 31.

Figure 3A:
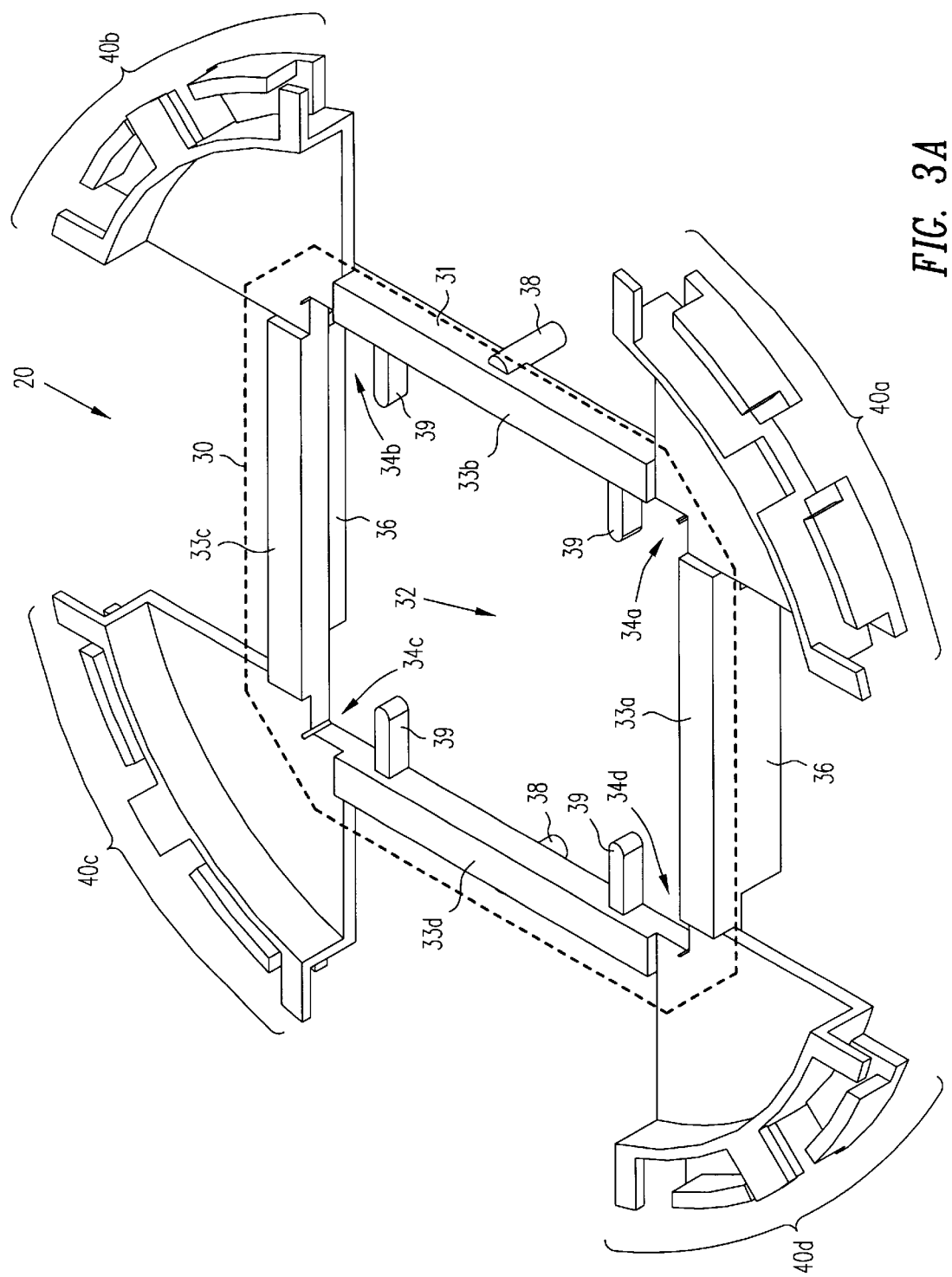
FIGS. 3A–3C illustrate, in perspective view, plan view, and side view, respectively, a dual purpose clip that includes a fiber guide and a heatsink clip integrally connected to one another in one embodiment of the indirect mounting illustrated in FIG. 2b.
Figure 3B:
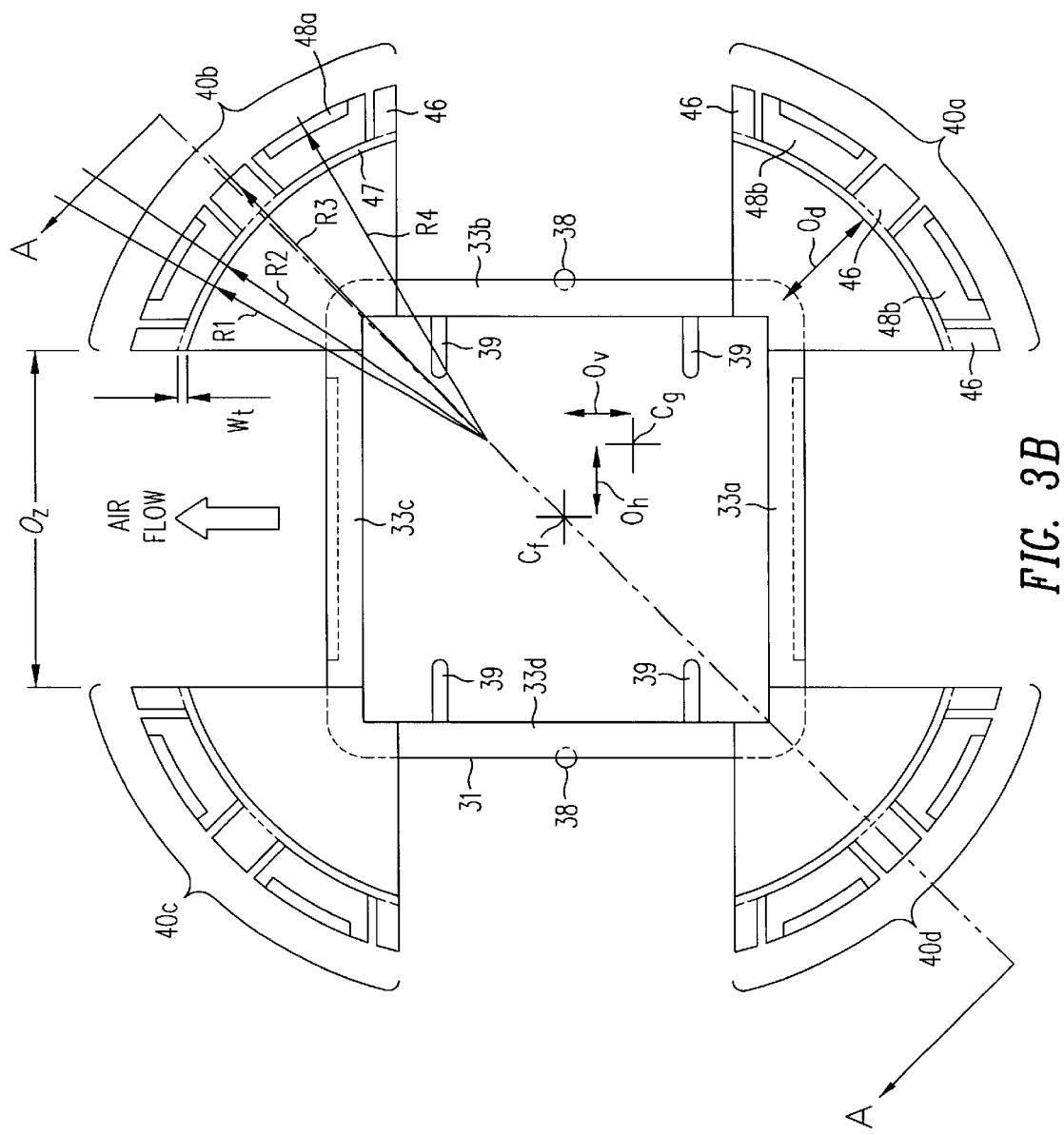
Figure 3C:
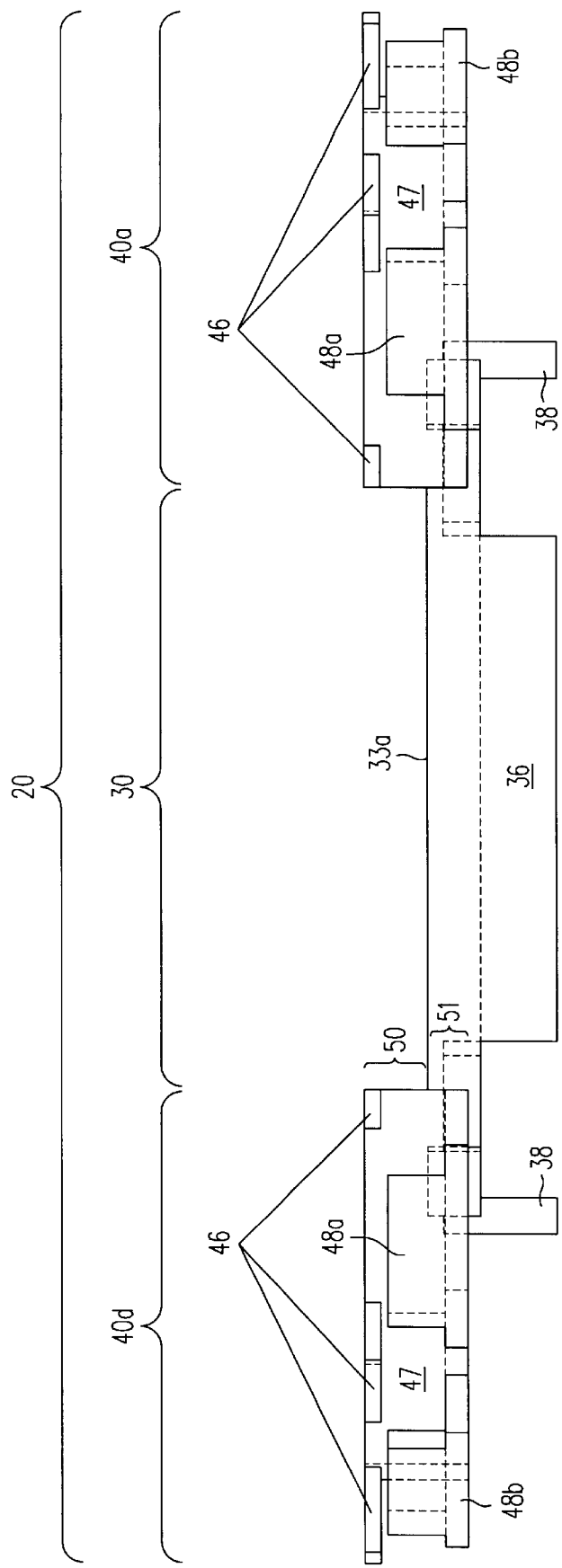

In the embodiment shown in FIGS. 3A–3C, there are two types of fasteners: side plates 36 and protruding rods 38. A "fastener," as used herein, is a physical element that keeps a heatsink fastened to a component to be cooled. Side plates 36 are connected to frame sides 33a and 33c, and one end is shaped into a fastening hook (not shown) for snapping on to a component or a printed circuit board. Protruding rods 38 are attached to frame sides 33b and 33d, and help the heatsink stay in contact with a component. Device 20 may also have elastic rods 39 protruding from the inner side walls of frame 31 into hole 32 to provide extra stability and security.

A person of ordinary skill in the art would understand that other structures for device 20 are possible in view of this disclosure. For example, frame 31 and hole 32 may each be of any other polygonal shape or even a circular shape. Clip 30 may be made of, for example, a flame-retardant plastic. In some embodiments, clip 30 is made of any material in conformance with UL-94 VO standard defined by Underwriters Laboratory, and examples of such materials include glass-filled nylon, polycarbonate and polyetherimide. In other embodiments, the material of clip 30 need not conform to UL-94 VO, and any thermosetting or thermoplastic material may be used. Other kinds of materials of which clip 30 may be formed include, for example, aluminum (in low component wattage scenarios) and zinc (which may be die cast).

As noted above, fiber guides 40a–40d may be made of the same flame-retardant material as clip 30, and in one embodiment the entire device 20 is formed as a single piece, e.g. by injection molding (such as reaction injection molding), or casting (e.g. low volume production based on urethane) or any other process. The arrangement and/or the number of fiber guides 40a–40d may be customized to a particular purpose, depending on the application. The fastening mechanism may be something other than a clip, such as a wire spring or a screw appropriate for fixing a heatsink in contact with a component or a printed circuit board.

Fiber guide 40a may be offset from a corner of frame 31, for example by a distance Od along the diagonal. The distance Od may be selected based on the needs of a specific application, such as a dimension (e.g. height) or a component. If an electronic component generates a large amount of heat, distance Od may be increased to ensure that a fiber optic cable supported within fiber guide 40a is not unduly heated by the heat conducted from the component. Furthermore, fiber guide 40a has one or more walls that form an arc of a circle that is centered at Cg, and such a circle's center is separated from a center Cf of frame 31 by an offset distance Ov in the vertical direction (relative to FIG. 3B) and another offset distance Oh in the horizontal direction. Distances Oh and Ov may be identical in case of a frame 31 of a square shape.

In one specific embodiment, the distances Ov and Oh are selected by maximizing a separation distance Oz between two adjacent fiber guides, such as guides 40d and 40a (see FIG. 3B). The distance Oz is maximized to ensure a maximum flow of air between the guides, thereby to promote heat dissipation from the heatsink. Moreover, in FIG. 3B, the radius R2 is the outer radius of an inner wall 47 (shown more clearly in FIG. 3D), and is at least equal to if not greater than the minimum bend radius (described elsewhere herein). The radius R1 is the inner radius of the inner wall 47, such that the difference between R2 and R1 is equal to the wall thickness Wt (which may be, for example, 0.035 inch). Wall thickness Wt may be selected based on, for example, the molding process, and the thickness required to maintain structural integrity.

In a similar manner, outer wall 48a has an outer radius R4, and an inner radius R3, and a difference between these two radii indicates the outer wall thickness (which may be greater than inner wall thickness Wt, e.g. by 50%). The inner radius R3 is selected such that a difference between R3 and R2 is a sufficiently large distance (e.g. 0.13 inch) to hold the number of fiber optic cables that need to be routed around the electronic component. Note that a larger distance may be used, to provide sufficient space for the fiber optic cables to be placed in the space 45 that is surrounded by the four walls, namely the inner and outer walls 47 and 48a, and the bottom and top walls 48b, 46.

The height of sidewalls 47 and 48a may also be selected based on the dimensions of space 45 (e.g. 0.125 inch). The dimensions and the positions of the bottom and top walls 48*b* and 46 are selected in a manner similar to that discussed above in reference to the inner and outer walls.

The specific dimensions of fibers guides 40*a*–40*d* may be selected depending on the application, for example, to ensure that one or more fiber optic cables may be installed within space 45 (also called "channel 45") without kinking of the fiber optic cable, and once the fiber optic cable is installed, the walls are sufficient to hold the fiber optic cable in space 45 (i.e. the fiber optic cable does not fall out during normal handling of the printed circuit board). One or more of the four walls 48*a*, 48*b*, 46 and 47 may have one or more cutouts to simplify the mold design. In one particular embodiment, the mold has no slides or undercut features, although depending on the embodiment, holder 42 may have various features that are apparent to the skilled artisan in view of this disclosure.

FIG. 3C depicts a side view of device 20 including heatsink clip 30 and fiber guides 40*a*–40*d*. One of side plates 36 is attached to frame side 33*a* and extends toward where a component would be. Protruding rods 38, attached to frame sides 33*b* and 33*d* (FIG. 3A), extend in substantially the same direction as side plates 36. Fiber guides 40*a*–40*d* are positioned so that an upper part 50 protrudes above the top surface of frame 31 and a lower part 51 is at approximately the same vertical level as frame side 33*a*. Inner sidewall 47 stretches across upper part 50 and lower part 51. Top wall 46 of holder 42 is connected close to an edge of sidewall 47 in upper part 50. Outer sidewall 48*a* and bottom wall 48*b* are connected to one another, close to a lower edge of inner sidewall 47.

Figure 3D:
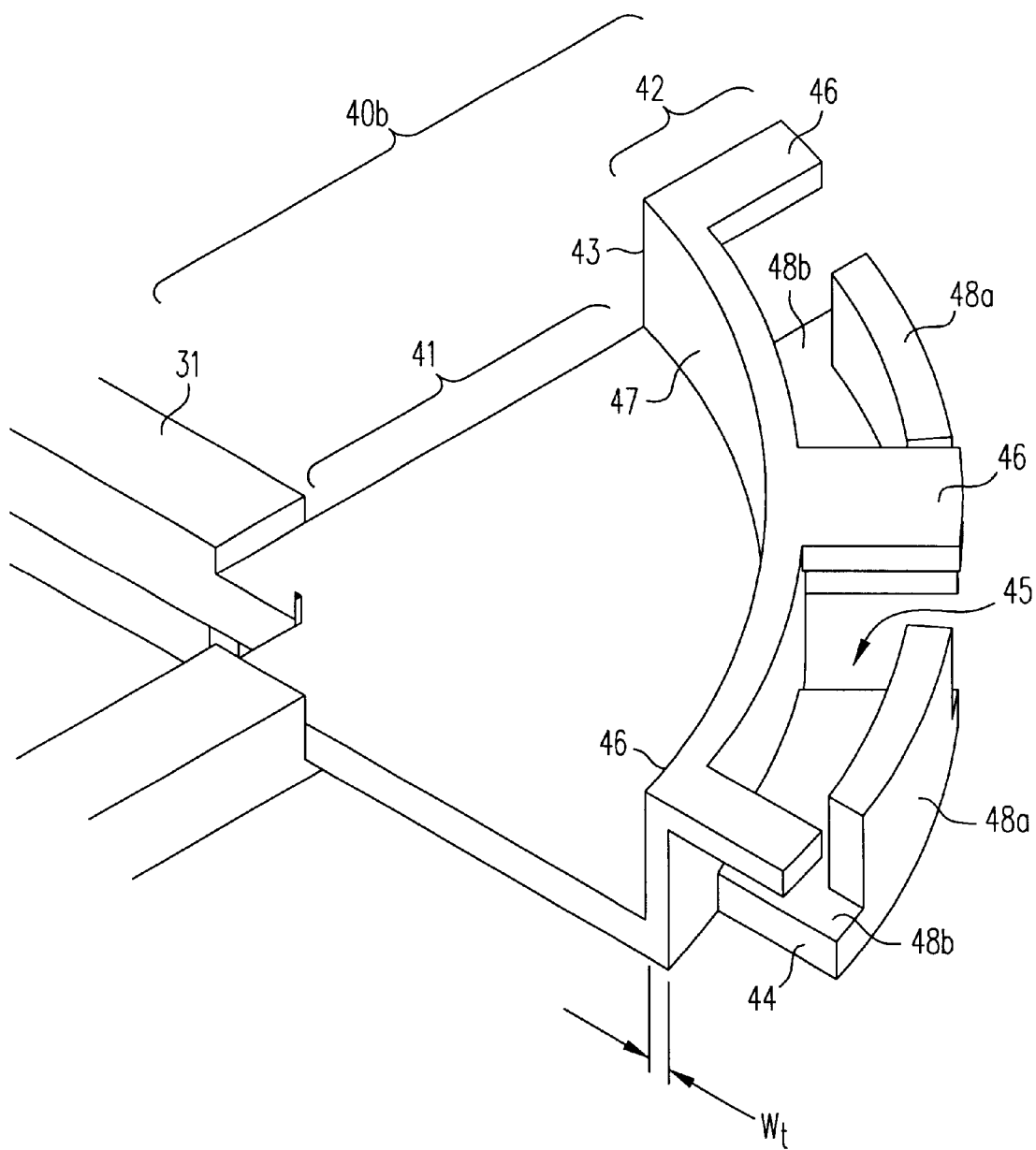
FIG. 3D illustrates, in a partial perspective view, a fiber guide used in the device of FIGS. 3A–3C.

FIG. 3D depicts a perspective view of fiber guide 40*b*. In one embodiment of a device 20, fiber guides 40*a*–40*d* are substantially similar or identical to one another, although in other embodiments they can be each different in shape and/or size. Fiber guide 40*b*, which is shaped generally like a sector of a circle, may include a connector 41 and holder 42. Connector 41 connects holder 42 to frame 31. Holder 42 forms an annular space 45 that extends from a first end 43 to a second end 44 and space 45 has sufficient dimensions to accommodate an optical fiber cable. An optical fiber cable extends from first end 43 to second end 44 when placed in space 45. As noted above, holder 42 is shaped and located to allow positioning and routing an optical fiber cable around various electrical components and hardware on the printed circuit board. For example, the curvature of holder 42 ensures that a fiber optic cable that occupies space 45 would not be bent more than its minimum bend radius. The minimum bend radius may be defined by a standard for fiber optic cables, e.g. 35 mm for buffered (unjacketed) fiber cables, as defined by Telcordia Technologies Inc., Morristown, N.J. However, radii down to 19 mm are widely accepted on jacketed Kevlar-wrapped fiber. Therefore, the curvature of holder 42 may be based on a 19 mm radius, depending on the embodiment.

In one embodiment, holder 42 includes a top wall 46, an inner sidewall 47, outer sidewall 48*a*, and bottom wall 48*b* attached to sidewall 47. Walls 48*a* and 48*b* are connected to one another. Top wall 46, inner sidewall 47, and walls 48*a* and 48*b* together form space 45 for partially enclosing an optical fiber cable. A person of ordinary skill in the art will understand that walls of different designs are possible for a fiber guide that is attached to a heatsink fastener or clip, in the manner described herein.

Figure 4:
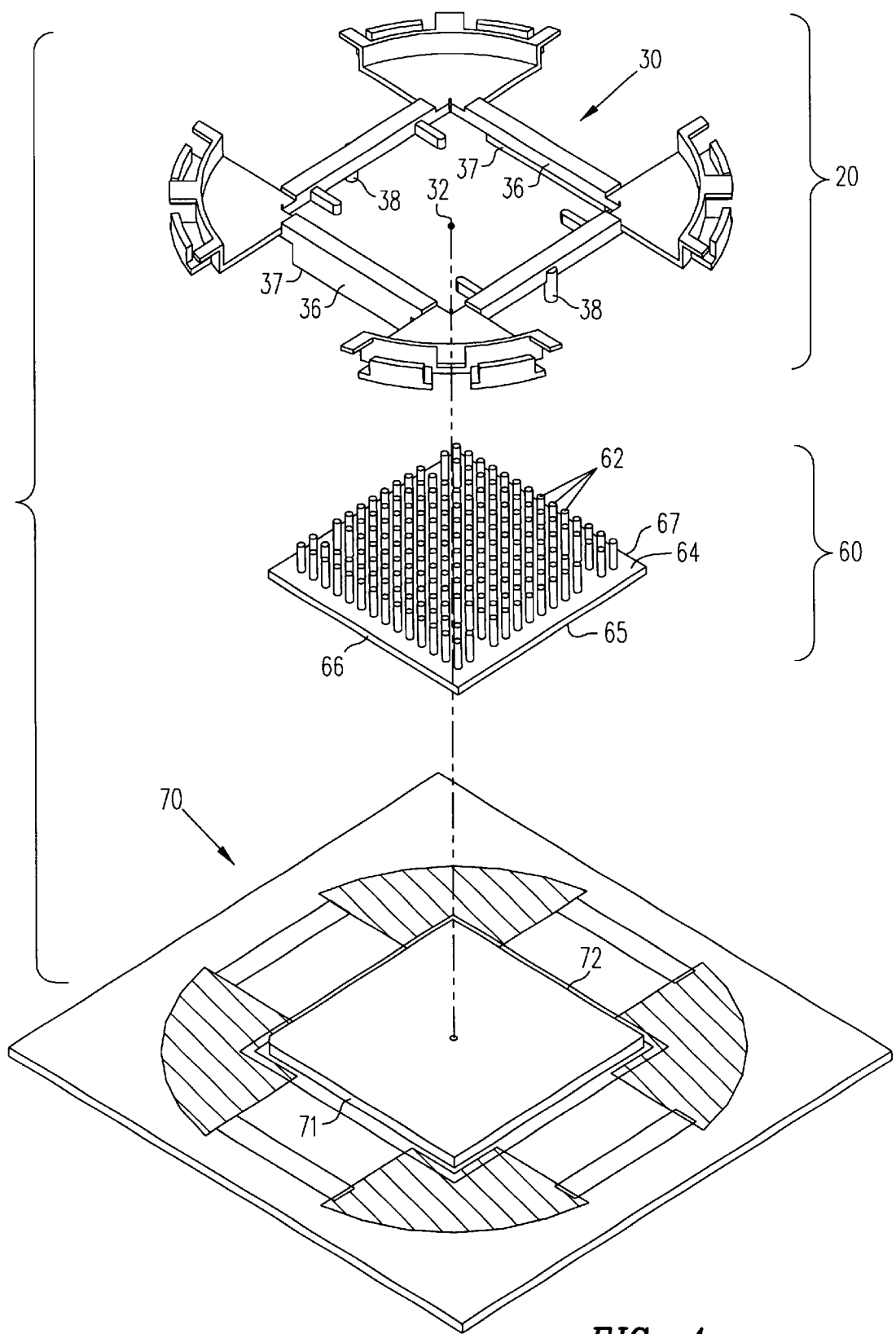
FIG. 4 illustrates, in an exploded view, the device of FIGS. 3A–3C in assembly with a heatsink, and a printed circuit board, in accordance with the invention.

FIG. 4 depicts a method of using device 20 to fasten a heatsink 60 to component 70, in accordance with one embodiment of the present invention. In the embodiment shown, clip 30 is used to attach heatsink 60 to component 70. Heatsink 60 includes top surface 64 and bottom surface 65, and may have protrusions 62 on at least one surface to increase heat dissipation efficiency. For more information on heatsink 60, see the U.S. patent application Ser. No. 10/071,968 that was incorporated by reference above.

In the embodiment shown, heatsink 60 has protrusions 62 on top surface 64. In fastening heatsink 60 to component 70, protrusions 62 are inserted upwards through hole 32 of device 20 until clip 30 touches top surface 64. If clip 30 includes elastic rods 39, elastic rods 39 may be in contact with surface 64. Clip 30 and heatsink 60 may be designed so that insertion of protrusions 62 through hole 32 results in downward extensions of side plates 36 and protruding rods 38, past the edges of heatsink 60.

Component 70 is positioned so that edge 66 of heatsink 60 is aligned with edge 71 of component 70, and the portions of side plates 36 that extend past heatsink 60 contact edges 71 and 72. Fastening hooks 37 (described below in detail in reference to FIG. 6) at the ends of side plates 36 snap on to edges 71 and 72 and hold heatsink 60 against component 70. When dissembling the heatsink device, clip 30 can be pulled to the side and/or upward so that it releases component 70 from the grip of fastening hooks 37.

Figure 1:
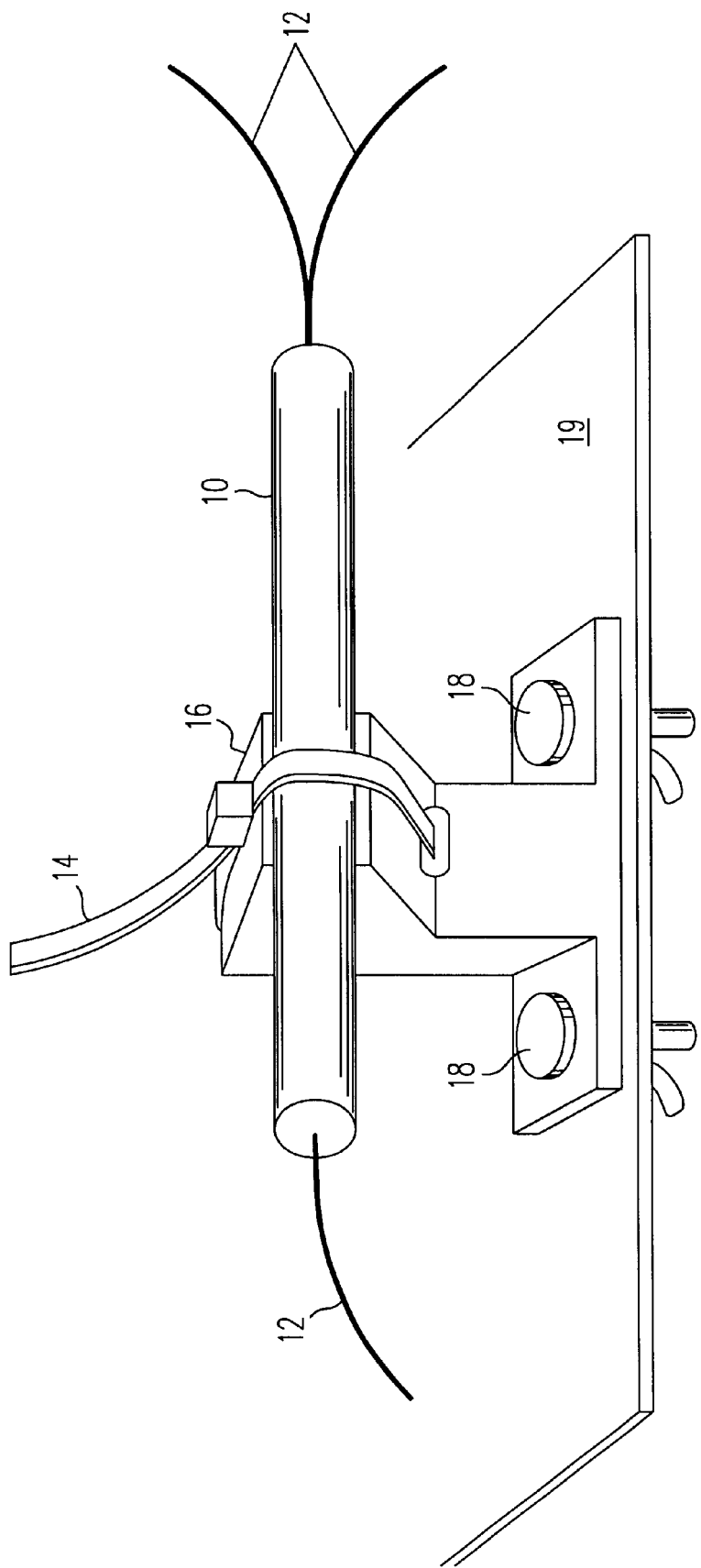
FIG. 1 illustrates, in a perspective view, a fiber guide that is mounted directly on a printed circuit board, in the prior art.
Figure 5:
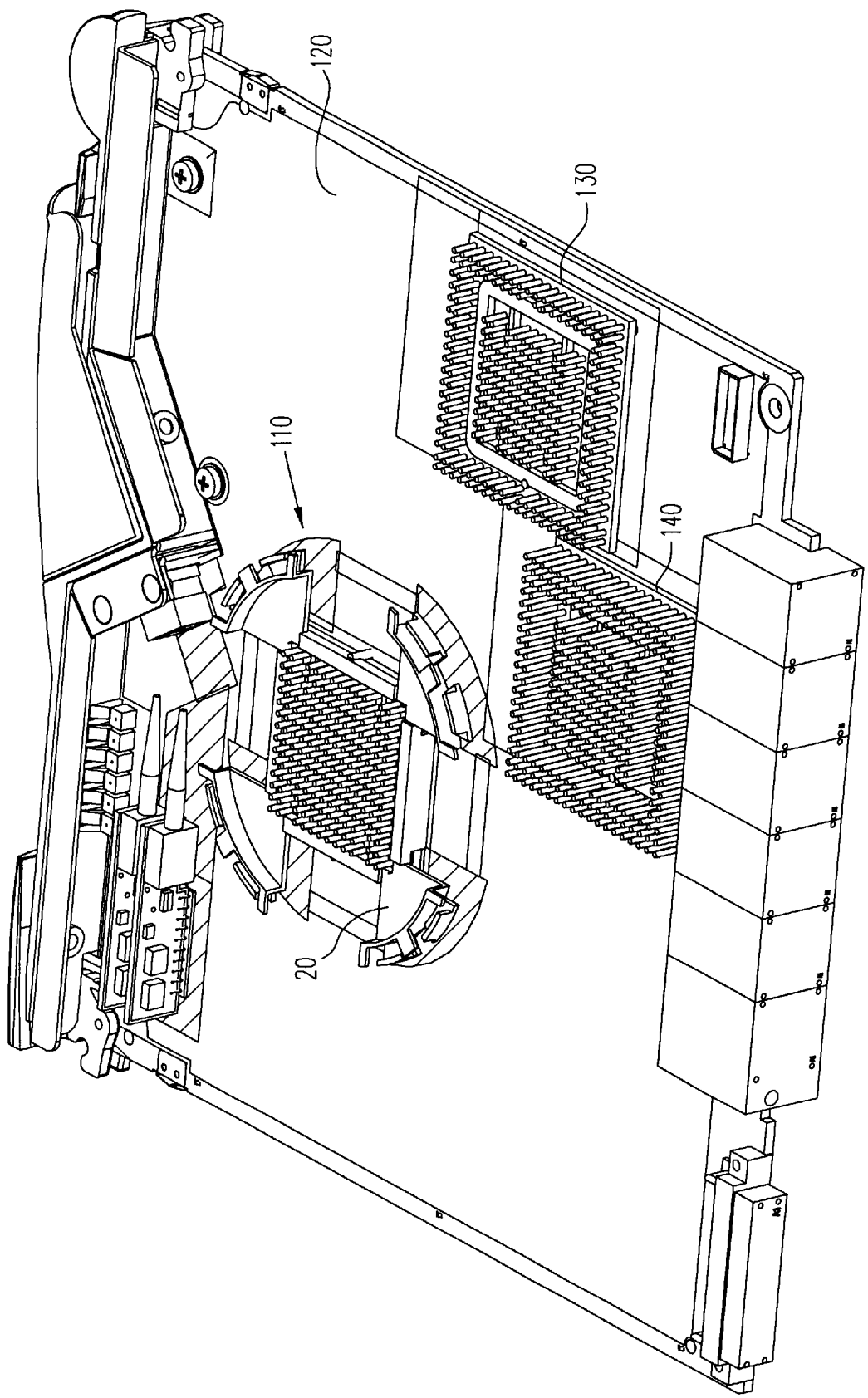
FIG. 5 illustrates, in a perspective view, the parts of FIG. 4 when assembled.

FIG. 5 depicts a device 110 assembled using device 20 located on a printed circuit board 120, in accordance with one embodiment of the present invention. As printed circuit board 120 is crowded with other components (e.g., component 130 and component 140) and circuitry (not shown), routing an optical fiber cable on printed circuit board 120 without damaging the fragile cable and without interfering with other components is difficult. Unlike holder 16 (FIG. 1), which crowds printed circuit board 120 even more by taking up board space, device 20 is fastened to a component with a heatsink that is already on printed circuit board 120. Furthermore, since device 20 can attach to either the component or to the printed circuit board, device 20 allows design flexibility as to whether the printed circuit board is to have a cutout.

Figure 6:
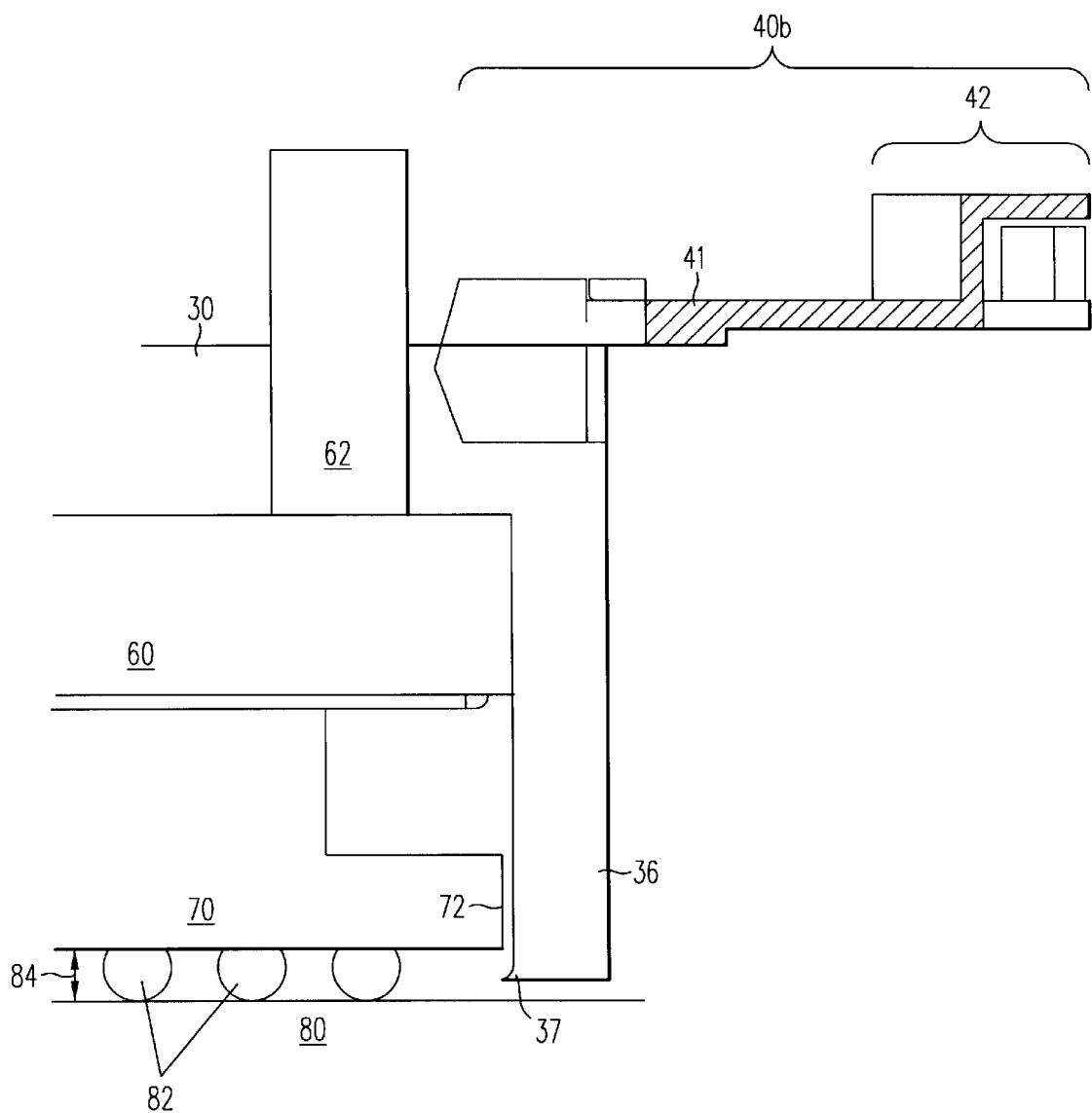
FIG. 6 illustrates, in a partial cross-sectional view, use of the dual purpose clip of FIGS. 3A–3C directly mounted on an electronic component that in turn is mounted on a printed circuit board.

FIG. 6 depicts a mechanism whereby device 20 fastens a heatsink directly to a component, in accordance with one embodiment of the present invention. The fastening mechanism depicted is one of side plates 36 with a fastening hook 37 at one end. The depicted side plate 36 extends past heatsink 60 to component 70, which is bonded to printed circuit board 80 by a conventional method, (e.g. soldering) to obtain grid array 82. The method of bonding component 70 to printed circuit board 80 may leave a distance 84 between component 70 and printed circuit board 80 so that fastening hook 37 can wrap around edge 72 of component 70 without causing damage to component 70, printed circuit board 80, or the bond. The fastening mechanism shown in FIG. 6 may be used where a hole in printed circuit board 80 would impose an undue restriction on conductive trace within the printed circuit board.

Figure 7:
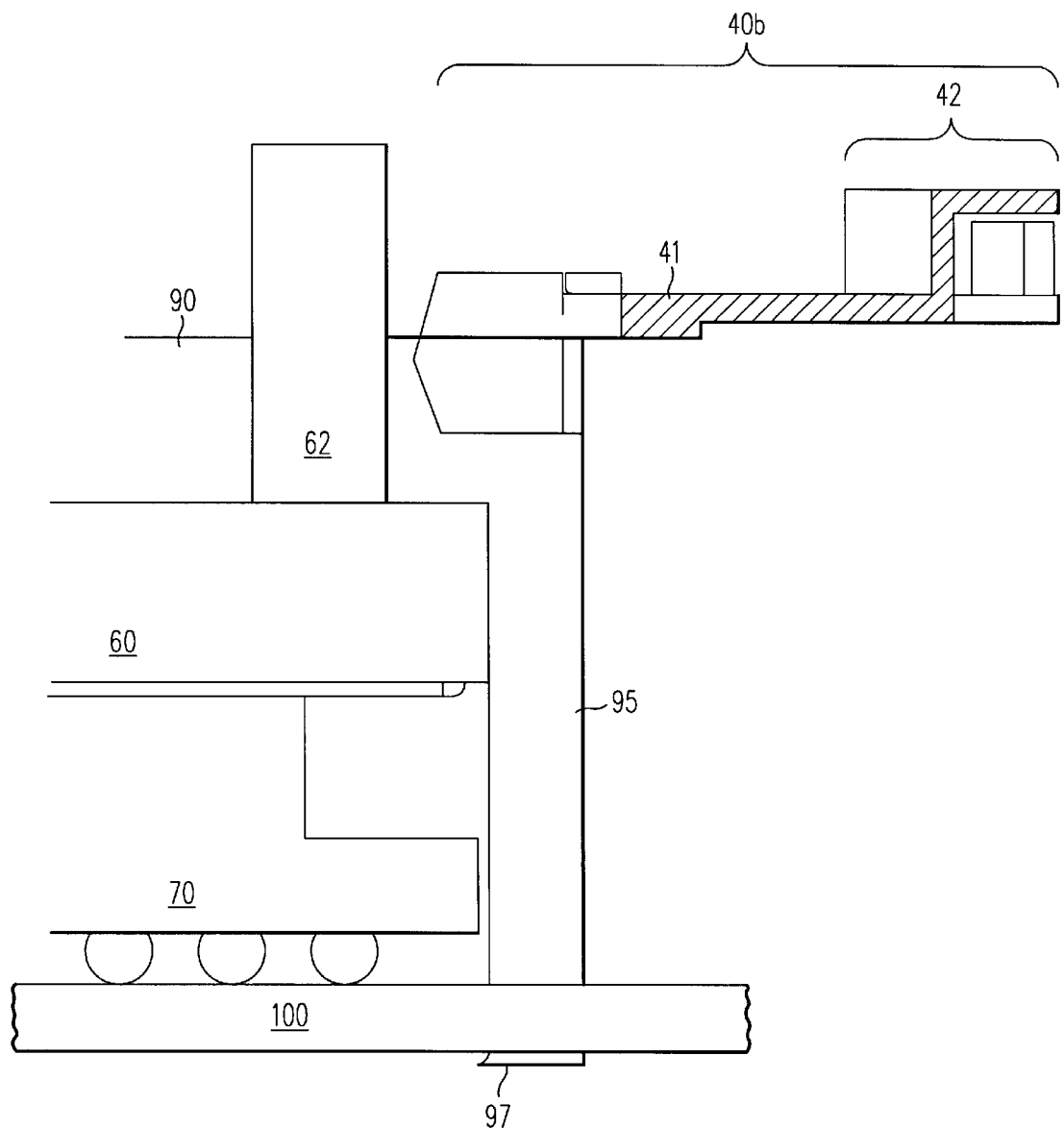
FIG. 7 illustrates an alternative embodiment of the device of FIGS. 3A–3C, mounted directly on a printed circuit board.

FIG. 7 depicts a mechanism whereby device 20 secures a heatsink 60 relative to a printed circuit board 100, with a component 70 located between heatsink 60 and printed circuit board 100, in accordance with another embodiment of the present invention. The fastening mechanism depicted includes clip 90, which may be similar to clip 30 in all regards except for the size of fasteners Although clip 90 has side plate 95 with fastening hook 97 at one end just as clip 30 has side plate 36 with fastening hook 37 at one end, side plate 95 extends through a cutout in printed circuit board 100, unlike side plate 36. Printed circuit board 100, unlike printed circuit board 80 (FIG. 6), has two cutouts that allow side plate 95 to extend past the printed circuit board.

While particular examples, embodiments and implementations of the present invention have been shown and described, it will be apparent to those skilled in the art that changes and modifications may be made without departing from this invention in its broader aspects. Although the use of fiber guides has been illustrated in certain drawings based on a specific heatsink clip in one embodiment, other heatsink clips are used in other embodiments. Moreover, the positions of the fiber guides and the fasteners relative to a heatsink clip's frame can be reversed relative to one another, e.g. the fasteners could be integrally connected to the frame at the four corners while the fiber guides are integrally connected to the frame at its four sides. Furthermore, depending on the application, there may only be one, two, or three guides connected to a rectangular frame. Also, depending on the embodiment, fiber guides may be integrally connected to a first frame which is different from a second frame that is integrally connected to the fasteners. In such an embodiment, the two frames may be either connected to one another, or both be individually mounted on the same heatsink and/or electronic component. Moreover, offset distances Ov and Oh can be reduced to even zero in some embodiments, e.g. if the radii R1–R4 are increased by the same amount. Numerous such modifications, adaptations, and variations of the embodiments, examples and implementations described herein will be apparent to the skilled artisan in view of the disclosure. Therefore, the appended claims are to encompass within their scope all such changes and modifications that fall within the true spirit and scope of this invention.

What is claimed is:

1. A device for fastening a heatsink and supporting a cable on a printed circuit board, the device comprising:
    a heatsink clip; and
    a fiber guide attached to the heatsink clip, the fiber guide comprising a first wall and a second wall spaced apart from the first wall, the first wall having a portion opposite to an opening in the second wall and the second wall having a portion opposite to an opening in the first wall, and the first wall and the second wall being sufficiently apart to accomodate the cable.

2. A device for fastening a heatsink and supporting a cable on a printed circuit board, the device comprising:
    a heatsink clip; and
    a fiber guide attached to the heatsink clip;
    wherein the heatsink clip comprises:
        a frame; and
        a fastener for fastening the heatsink to at least one of a component and a printed circuit board, the fastener being connected to the frame;
    wherein the fiber guide is attached to the frame.

3. The device of claim 1, wherein the fastener comprises a snap-on mechanism protruding from the frame.

4. A device for fastening a heatsink and supporting a cable on a printed circuit board, the device comprising:
    a heatsink clip; and
    a fiber guide attached to the heatsink clip;
    wherein the fiber guide is shaped like a sector of a circle and the structure is located along the arc of the sector.

5. A device for fastening a heatsink and supporting a cable on a printed circuit board, the device comprising:
    a heatsink clip; and
    a fiber guide attached to the heatsink clip, the fiber guide comprising a structure to at least partially enclose an optical fiber cable;
    wherein the structure has a curvature less than the curvature defined by a minimum bend radius of an optical fiber cable.

6. A device for fastening a heatsink and supporting a cable on a printed circuit board, the device comprising:
    a heatsink clip; and
    a fiber guide attached to the heatsink clip;
    wherein the heatsink clip has a rectangular shape and the at least one fiber guide is attached to a corner of the heatsink clip.

7. A device for fastening a heatsink and supporting a cable on a printed circuit board, the device comprising:
    a heatsink clip; and
    a fiber guide attached to the heatsink clip;
    wherein the fiber guide is an integral extension of the heatsink clip.

8. A method of using a single device to support multiple items on a printed circuit board, the method comprising:
    attaching a heatsink to an electronic component using said device; and
    routing a fiber optic cable through a channel within said device, forming a heatsink clip and a fiber guide as two portions of said device, in a single operation.

9. The method of claim 8 wherein:
    the operation comprises molding.

10. The method of claim 8 further comprising attaching said device to a printed circuit board.

11. A device for fastening a heatsink and supporting a fiber optic cable on a printed circuit board, the device comprising:
    a heatsink clip comprising a rectangular frame surrounding a rectangular hole, and four fasteners connected to four sides of the rectangular frame; and
    four fiber guides, each fiber guide being connected to a corner of the rectangular frame, each fiber guide being formed as an integral extension of the heatsink clip, each fiber guide having a plurality of walls enclosing a channel of sufficient dimensions to hold at least said fiber optic cable.

12. The device of claim 11 wherein:
    the plurality of walls include two sidewalls, a bottom wall and a top wall.

13. The device of claim 12 wherein:
    each sidewall has a curvature less than a minimum bend radius of the fiber optic cable.

14. A device for fastening a heatsink and supporting a fiber optic cable on a printed circuit board, the device comprising:
    a heat sink fastening mechanism unitary with the heat sink; and
    a plurality of fiber guides, each fiber guide being formed as an integral extension of the fastening mechanism, each fiber guide having a plurality of walls defining a channel of sufficient dimensions to allow routing of the fiber optic cable therethrough, the channel having a curvature less than a minimum bend radius of the fiber optic cable.

15. An assembly comprising:
    the device of claim 14; and
    the fiber optic cable;
    wherein the fiber optic cable contacts at least a wall of the channel of one of the fiber guides.

16. The device of claim 14 wherein:

the fastening mechanism comprises an item selected from a group consisting of (clip, wire spring and screw).

17. The device of claim 14 wherein:

the fastening mechanism comprises a frame and a plurality of fasteners connected to the frame.

18. The device of claim 17 wherein:

the frame is rectangular.

19. The device of claim 18 wherein:

the plurality of fiber guides are four in number; and the frame has one fiber guide on each corner thereof.

20. The device of claim 18 wherein:

the plurality of fasteners are four in number; and the frame has one fastener on each side thereof.

21. The device of claim 17 wherein:

at least one of the fasteners comprises a protruding rod.

22. The device of claim 17 wherein:

at least one of the fasteners comprises a side plate.

23. An assembly comprising:

the device of claim 14;

an electronic component; and a printed circuit board;

wherein the electronic component is located between and in contact with the heat sink and the printed circuit board, and the heat sink is located between and in contact with the electronic component and the fastening mechanism in the device of claim 14.

24. The assembly of claim 23 wherein:

at least a portion of the fastening mechanism spans across at least the heat sink and the electronic component.

25. The device of claim 14 wherein:

the plurality of walls comprises a first wall, and a second wall spaced apart from the first wall to at least partially define the channel, the first wall having a portion opposite to an opening in the second wall and the second wall having a portion opposite to an opening in the first wall.

26. The device of claim 14 wherein:

the fiber guide comprises a connector, the connector being shaped like a sector of a circle and the channel being located along the arc of the sector, the connector being integrally connected to the fastening mechanism.

27. The device of claim 14 wherein:

the fastening mechanism is integrally connected to each fiber guide so as to form a single element.

28. The method of claim 8 wherein:

the channel is curved; and the fiber optic cable is muted through the channel without kinking.

29. The method of claim 28 wherein:

the curvature of the channel is greater than or equal to a minimum bend radius of the fiber optic cable.

30. A device for supporting multiple items on a printed circuit board, the device comprising:

a heatsink means for attaching the heatsink to an electronic component; and means for routing a fiber optic cable, the means for routing being supported by the means for attaching, the means for routing having a channel of sufficient dimensions to allow routing of the fiber optic cable therethrough, the heat sink and the means for routing being unitary.

31. The device of claim 30 wherein:

the channel has a curvature less than a minimum bend radius of the fiber optic cable.

32. The device of claim 30 wherein:

the means for routing and the means for attaching are integrally connected to one another to form a single element.

33. An assembly comprising:

the device of claim 30;

an electronic component; and a printed circuit board;

wherein the electronic component is located between and in contact with the heat sink and the printed circuit board, and the heat sink is located between and in contact with the electronic component and the means for attaching in the device of claim 30.

* * * * *

UNITED STATES PATENT AND TRADEMARK OFFICE
CERTIFICATE OF CORRECTION

| | |
|---|---|
| PATENT NO. | : 6,661,663 B1 |
| APPLICATION NO. | : 10/072598 |
| DATED | : December 9, 2003 |
| INVENTOR(S) | : Meeker |

It is certified that error appears in the above-identified patent and that said Letters Patent is hereby corrected as shown below:

On Title Page Item (57) Col.2
<u>Abstract</u>
Line 3, "to be printed circuit board" should be -- to a printed circuit board --.

<u>Column 7</u>
Line 56, "claim 1," should be -- claim 2, --.

<u>Column 8</u>
Line 12, "comer" should be -- corner --.
Line 26, "device, forming" should be -- device; and forming" --.

<u>Column 10</u>
Line 16, "for attaching the heatsink" should be -- for attaching a heatsink --.

Signed and Sealed this

Eighth Day of August, 2006

JON W. DUDAS
*Director of the United States Patent and Trademark Office*